United States Patent
Pitts et al.

(10) Patent No.: US 6,709,225 B1
(45) Date of Patent: Mar. 23, 2004

(54) SYSTEM FOR INSTALLATION, MAINTENANCE AND REMOVAL OF MINIENVIRONMENT COMPONENTS

(75) Inventors: Leon Pitts, Carmel, CA (US); Jeffrey Rydman, Pleasanton, CA (US); Warren Oliver, San Jose, CA (US); Michael Neads, Fremont, CA (US)

(73) Assignee: Asyst Technologies, Inc., Fremont, CA (US)

( * ) Notice: Subject to any disclaimer, the term of this patent is extended or adjusted under 35 U.S.C. 154(b) by 0 days.

(21) Appl. No.: 09/507,556

(22) Filed: Feb. 18, 2000

(51) Int. Cl.<sup>7</sup> ............................................. B65G 67/00
(52) U.S. Cl. ..................... 414/787; 414/267; 414/396
(58) Field of Search .............................. 414/266, 267, 414/286, 331.06, 396, 400, 749.6, 787; 901/1, 50; 248/647, 650, 657

(56) References Cited

U.S. PATENT DOCUMENTS

| | | | | |
|---|---|---|---|---|
| 4,538,950 A | * | 9/1985 | Shiomi et al. | 414/396 |
| 4,664,590 A | * | 5/1987 | Maekawa | 901/6 |
| 4,697,974 A | * | 10/1987 | Eltoukhy | 414/396 |
| 4,744,712 A | * | 5/1988 | Mitchell | 414/217 |
| 5,417,537 A | * | 5/1995 | Miller | 414/396 |
| 5,441,376 A | * | 8/1995 | Napierkowski et al. | 414/396 |
| 5,474,411 A | * | 12/1995 | Schoenfeld et al. | 414/266 |
| 5,664,688 A | * | 9/1997 | Kitanaka et al. | 414/267 |
| 6,033,175 A | * | 3/2000 | Pflueger et al. | 414/396 |
| 6,176,668 B1 | * | 1/2001 | Kurita et al. | 414/217 |
| 6,301,776 B1 | * | 10/2001 | Myung et al. | 414/396 |
| 6,494,671 B1 | * | 12/2002 | Takaiti et al. | 414/809 |

* cited by examiner

Primary Examiner—James W. Keenan
(74) Attorney, Agent, or Firm—O'Melveny & Myers LLP

(57) ABSTRACT

A system is disclosed for allowing quick and easy installation, maintenance and removal of components within a piece of equipment which may be attached to a front end of processing tool or stand alone unit in a semiconductor processing fab. In a first embodiment, the system includes a translation assembly and a pair of tracks fixedly mounted in frame of the equipment. The translation assembly in this embodiment includes a trolley having four wheels which ride on a portion of each of the tracks. When a component is to be assembled into the piece of equipment, the component is first bolted to the trolley. The trolley and attached component may then be inserted into the frame. The wheels riding on the tracks allow the robot to be quickly and easily moved to its proper position within the equipment. Once properly located, jackscrews threaded through the trolley are rotated to raise the trolley wheels off of the tracks, and to level the trolley and component. The trolley is then bolted down to the track and frame to securely fix the position of the component in the equipment.

3 Claims, 6 Drawing Sheets

SYSTEM FOR INSTALLATION, MAINTENANCE AND REMOVAL OF MINIENVIRONMENT COMPONENTS

BACKGROUND OF THE INVENTION

1. Field of the Invention

The present invention relates to front end components in a semiconductor wafer fab, and in particular to a system allowing quick and easy installation, maintenance and removal of components within a minienvironment at a front end of a semiconductor processing tool.

2. Description of the Related Art

A typical semiconductor wafer fab includes a plurality of tool bays, each on the order of about eighty feet long, consisting in general of a number of processing tools for performing various wafer fabrication processes. The wafers are transported around the fab between the various processing tools within cassettes, which cassettes are themselves transported either bare or housed within enclosed containers. One type of conventional enclosed container is a so-called wafer lot carrier box which encloses the wafers but does not seal the wafers off against the fab environment. A second type of conventional container is a so-called standard mechanical interface ("SMIF") pod which is sealed against the fab environment. A SMIF system offers several advantages including automated wafer transfer between pod and process tool while maintaining an ultraclean environment around the wafers.

Regardless of whether a fab is operating with open cassettes or containers such as lot boxes or SMIF pods, each processing tool in the fab includes front end equipment such as a minienvironment for facilitating transfer of the wafers or other workpieces between the cassette and the interior of the process tool. While front end minienvironments vary from fab to fab, such equipment may typically include a workpiece handling robot for transferring the workpieces between the cassette and the processing tool, as well as around the minienvironment; an aligner for identifying a center of the wafer and reading an optical code reader ("OCR") or other fiducial mark on the workpiece; and power and control electronics for operating the minienvironment. The front end minienvironment may further include a fan/filter unit for controlling the environment within the equipment, and a vacuum reservoir for communicating a vacuum through the robot to secure a workpiece onto the robot end effector by suction. Various other application-specific components may further be provided within the minienvironment as required.

Each wafer fab typically includes hundreds of such minienvironments for the various processing tools, metrology tools, and stand alone stations within the wafer fab. As such, significant time and manpower is devoted to assembling and disassembling each of the minienvironments, as well as to maintaining each of the minienvironments in working order. This problem is made worse by the fact that, owing to the high cost of maintaining an ultraclean environment within the minienvironment, the space within the minienvironment is made as small as possible, and the components within the minienvironment are packed closely together. This makes installation, access and removal of a single component difficult, and often requires that one or more other components be removed before the subject component can be accessed.

In conventional systems, when it is necessary to exchange or repair for example a robot, at least two technicians are needed. First, they must gain access to the robot either by removing other components or maneuvering around the other components. Then they must delicately lift the robot, which can weigh over two hundred pounds, around other components and out of the minienvironment. This procedure is time consuming, difficult and can result in damage to one or more of the components.

SUMMARY OF THE INVENTION

It is therefore an advantage of the present invention to reduce the effort required to install, repair or remove a component from equipment such as a minienvironment on the front end of a processing tool.

It is another advantage of the present invention to reduce the time required to install, repair or remove a component from equipment such as a minienvironment on the front end of a processing tool.

It is a further advantage of the present invention to reduce the risk of damage to a component within equipment such as a minienvironment on the front end of a processing tool during installation, repair or removal of that or other components.

These and other advantages are provided by the present invention which in one embodiment relates to a system allowing quick and easy installation, maintenance and removal of components within a piece of equipment which may be attached to a front end of processing tool or may be a stand alone unit. In a first embodiment, the system includes a translation assembly and a pair of tracks fixedly mounted in frame of the equipment. The translation assembly in this embodiment includes a trolley having four wheels which ride on a portion of each of the tracks. When a component is to be assembled into the piece of equipment, the component is first bolted to the trolley. The trolley and attached component may then be inserted into the frame. The wheels riding on the tracks allow the robot to be quickly and easily moved to its proper position within the equipment. Once properly located, jackscrews threaded through the trolley are rotated to raise the trolley wheels off of the tracks, and to level the trolley and component. The trolley is then bolted down to the track and frame to securely fix the position of the component in the equipment.

In an alternative embodiment, the trolley and wheels are omitted, and instead a mounting plate supporting the component is provided which includes four ball casters at or near corners of the plate. The casters ride on the spaced apart tracks to allow easy loading and unloading of the robot into and from the frame. The casters are attached to the mounting plate via jackscrews which fit within threaded holes through the mounting plate. Once the robot is properly positioned within the frame, the jackscrews are rotated to lower the mounting plate until the plate is supported on vertical wall portions of the tracks and the casters no longer contact the tracks. The mounting plate may thereafter be bolted to the tracks to secure the mounting plate and component in a fixed position with respect to the tracks and frame.

A wide variety of components may be thus mounted into a piece of equipment for quick and easy installation, maintenance and removal, including for example, a workpiece handling robot, a workpiece aligner, a system controller, power and control components, pumps, vacuum reservoirs and environmental control units.

BRIEF DESCRIPTION OF THE DRAWINGS

The present invention will now be described with reference to the figures in which.

DETAILED DESCRIPTION

Figure 1:
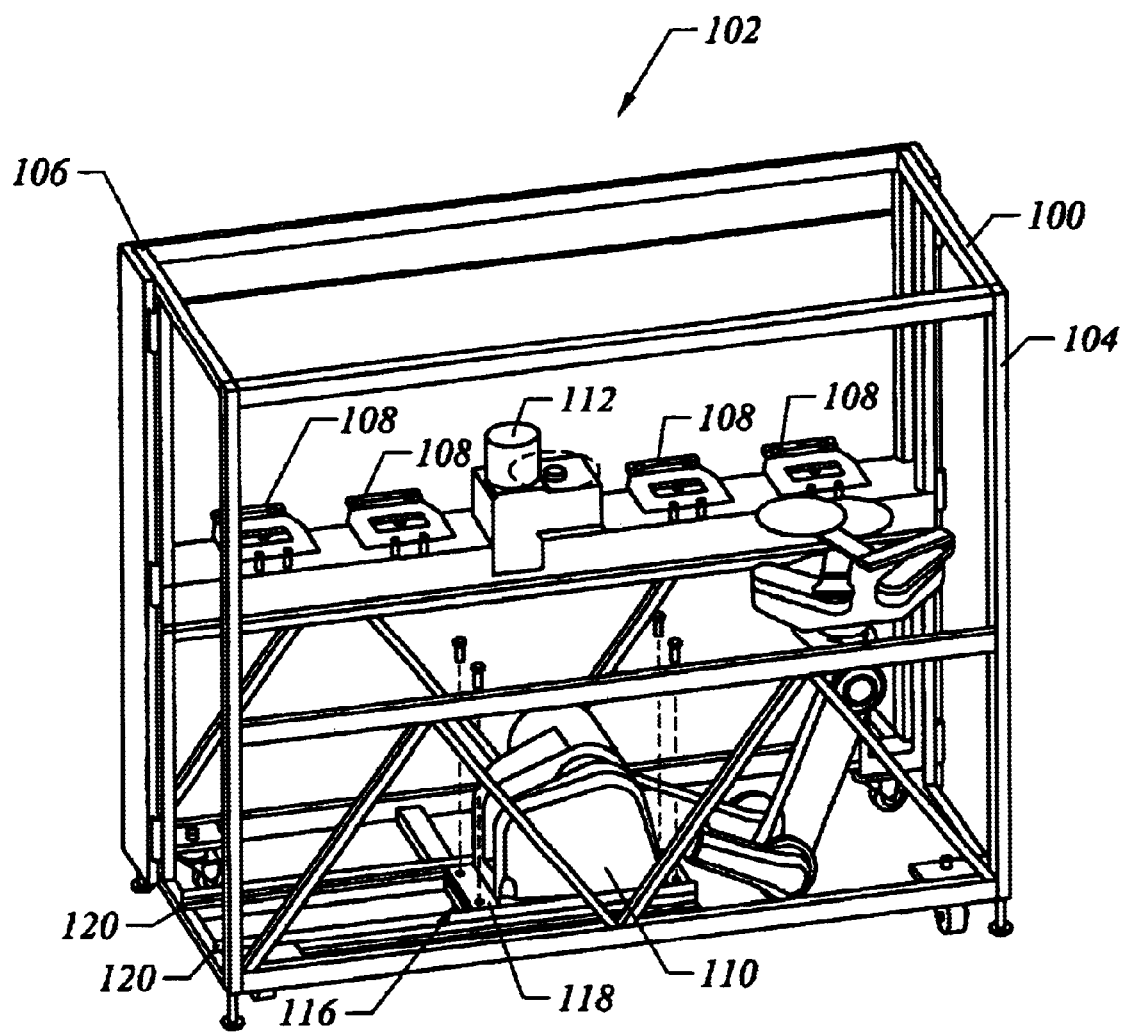
FIG. 1 is a perspective view of a piece of front end equipment including a system according to the first embodiment of the present invention for mounting a robot in the equipment.

The present invention will now be described with reference to FIGS. 1–7, which in general relate to a system allowing quick and easy installation, maintenance and removal of components used in a minienvironment at a front end of a semiconductor processing tool. It is understood that in alternative embodiments, the present invention may be used in equipment other than minienvironments, or where the minienvironment is integrated into and is part of the process tool. It is further understood that the present invention may be used with apparatus other than process tools in alternative embodiments. The wafer transfer scheme is additionally not critical to the present invention, and the present invention may operate with open cassettes, lot boxes, SMIF pods and any other system for transferring workpieces into a process or other tool. Where operating with a SMIF system, the present invention conforms with and allows conformity with all applicable SEMI standards.

Referring now to FIGS. 1–4, there is shown the frame 100 for a piece of equipment 102 such as a minienvironment fitting on the front of a processing tool (not shown) to which a front 104 of frame 100 is affixed. This particular frame 100 is configured to operate with open cassettes such that the cassettes (not shown) are manually brought to a rear 106 of frame 100 and positioned on one of a plurality of cassette supports 108. As explained above, the present invention may be used with other workpiece transfer systems. Although not critical to the present invention, once a cassette is loaded onto a support 108, a robot 110 transfers workpieces from within the cassette to an aligner 112 to identify the radial runout of the workpiece and to read the OCR or other fiducial mark on the workpiece. Thereafter, the workpiece may be transferred from the aligner 112 by the robot 110 back to its original cassette, to another cassette or into the processing tool. The equipment 102 may further include a controller 114 (FIG. 2) for controlling the operation of robot 110 and aligner 112.

Figure 2:
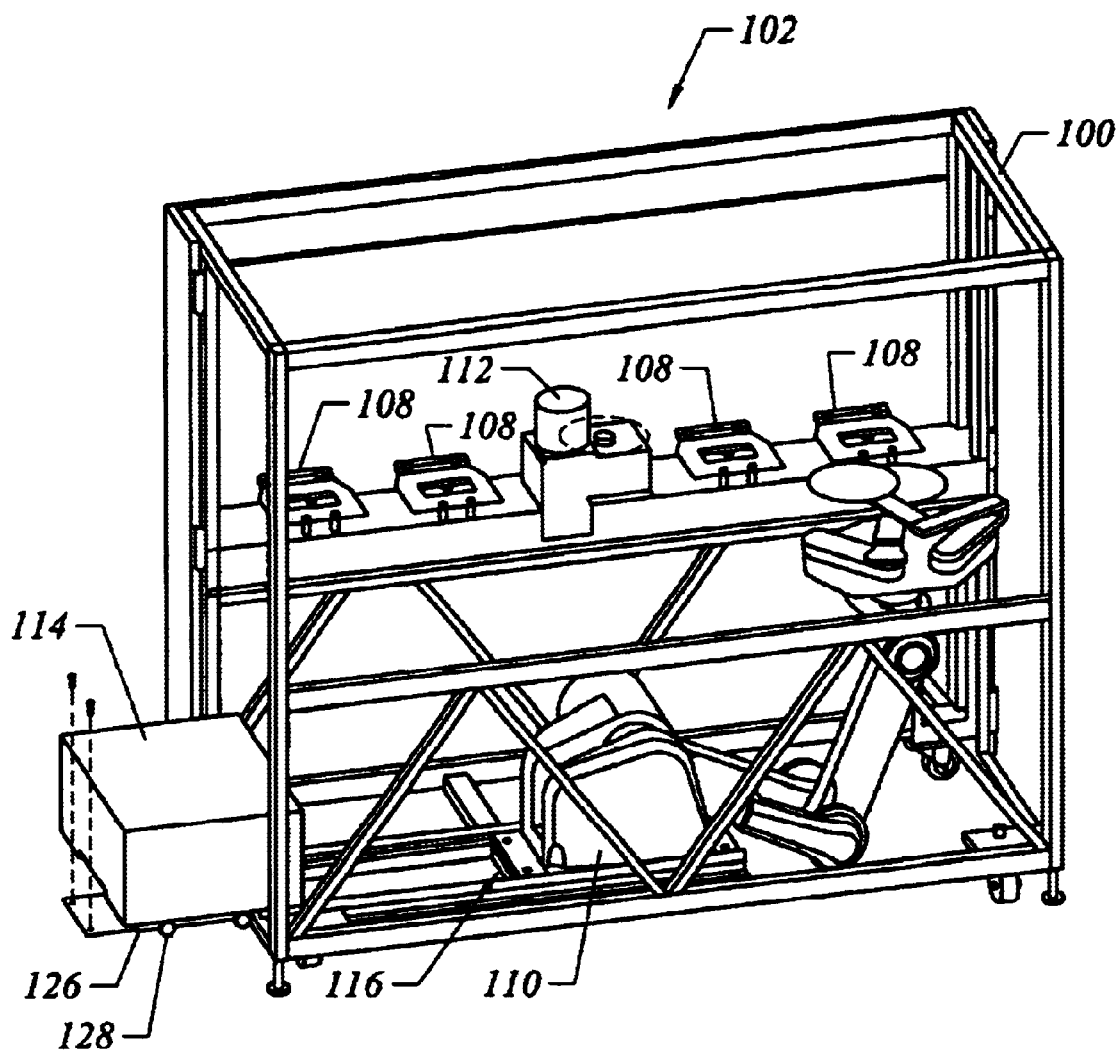
FIG. 2 is a perspective view of a piece of front end equipment including a system according to the first embodiment of the present invention for mounting a robot and a controller in the equipment.
Figure 3:
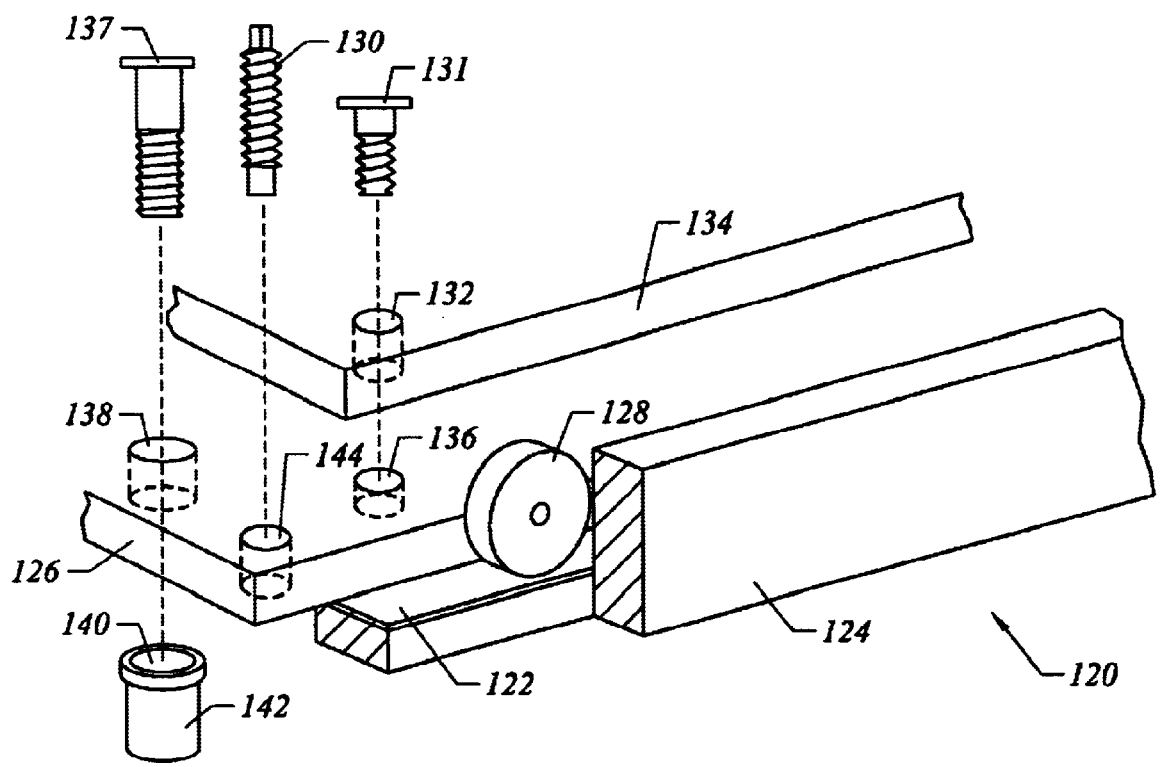
FIG. 3 is an enlarged, exploded perspective view showing a portion of the system according to the present invention for mounting components within a piece of equipment.

According to the present invention, FIGS. 1–4 further show a system 116 for facilitating assembly, maintenance and disassembly of the components such as robot 110 within the equipment 102. System 116 includes a translation assembly 118, a pair of spaced tracks 120 fixedly mounted in frame 100 and a pair of cross members 121 fixedly mounted in frame 100. The tracks 120 extend generally along the length dimension of the frame, and the cross members 121 extend generally across the width dimension of the frame. The system 100 shown in FIGS. 1–4 is a bottom plane system, where tracks 120 and cross members 121 are mounted at a bottom of frame 100, in a generally horizontal plane. As best seen in FIG. 3, tracks 120 each include a horizontal base portion 122 and a vertical wall portion 124.

Referring to FIGS. 1–4, in one embodiment of the present invention, translation assembly 118 includes a trolley 126 having four wheels 128 which ride on horizontal base portion 122 of each track 120. When a component such as robot 110 is to be assembled into the equipment 102, a base 134 of the robot is initially bolted to the trolley 126 by bolts 131 fitting through through holes 132 in base 134 and into threaded holes 136 formed partially through the trolley. The robot is thus fixedly mounted on trolley 126.

The trolley and robot may then be inserted into the frame. The wheels 128 riding on tracks 120 allow the robot to be quickly and easily moved to its proper position within the equipment. Once properly located, the position of the trolley and robot may be preliminarily secured by bolts 137 fitting through through holes 138 in the trolley and into threaded holes 140 formed in bosses 142 extending up from the cross members 121.

The translation assembly 118 further includes four jackscrews 130 fitting down through threaded holes 144 in the trolley 126. Once the robot is properly positioned and prior to tightening down bolts 137, the jackscrews 130 are rotated resulting in downward translation of the jackscrews relative to trolley 126 so that the jackscrews contact horizontal base portion 122 of tracks 120. Continued rotation of the jackscrews in this direction lifts the trolley 126 and wheels 128 off of the tracks 120 so that the trolley 126 and robot 110 are now supported in a fixed position on tracks 120 by jackscrews 130. The jackscrews 130 may thereafter be individually adjusted to provide course adjustment of the planarity of the robot within the equipment 102 (the robot includes its own adjustment mechanisms to provide fine adjustment of the robot planarity after the robot is secured).

After each of the wheels 128 had been lifted off of tracks 120, and the planarity of the robot has been properly adjusted, the bolts 137 may be tightened down to securely fix the position of the robot in the frame 100.

In order to perform maintenance on robot 110, or otherwise remove the robot 110 from the equipment 102, the bolts 137 are removed, the jackscrews are rotated in their opposite direction until the wheels 128 are each again supported on tracks 120, and then the robot may be easily wheeled out of the frame 100 on the trolley 126.

In one embodiment of the present invention, the system 116 may further include a cart 146 positioned outside of frame 100 as shown in FIG. 1. The cart 146 includes a pair of fixed tracks 148 of similar configuration to tracks 118, at the same elevation as tracks 118 and spaced apart the same distance as tracks 118. The cart may be pulled up to frame 100 so that tracks 148 on the cart 146 mate with the tracks 118 in the frame 100. Thus, a component mounted on a trolley 126 may be easily brought to the equipment 102 on the cart 146 and easily wheeled from tracks 148 to tracks 120 within the equipment. Similarly, when removing a component, it may be easily wheeled from tracks 120 onto tracks 148 on the cart. It is understood that the cart 146 may be omitted in alternative embodiments.

Figure 4:
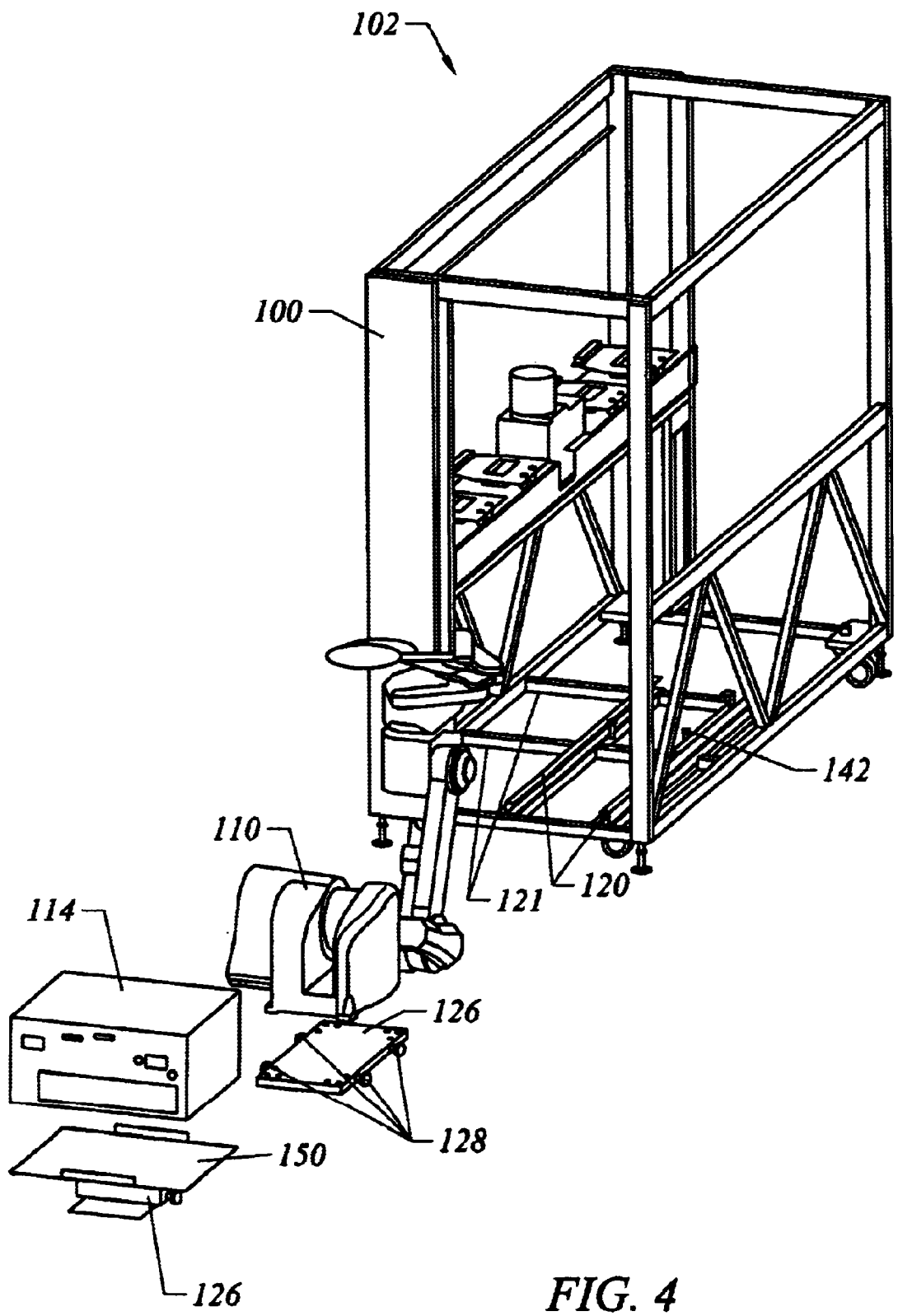
FIG. 4 is an exploded perspective view of the system according to the present invention for mounting components within a piece of equipment.

More than one component may be mounted on respective trolleys 126 for quick and easy loading into equipment 102. For example, as shown in FIGS. 2 and 4, the controller 114 may also be mounted on a second trolley 126. As it is not critical that the controller be secured in a fixed position within the equipment 102, the controller may simply be located on a platform 150 which is either secured to or only supported on the trolley 126. It is understood however that the controller may be mounted directly to the trolley 126 via bolts 131 as described above in an alternative embodiment. Moreover, the trolley supporting the controller 114 may additionally include a set of four jackscrews for lifting the trolley wheels 128 off of the tracks 120 as described above once the controller is positioned within the frame. The trolley supporting the controller may alternatively further include bolts 137 fitting within a further set of bosses 142 as described above to further secure the controller in position.

Where two components, such as controller 114 and robot 110 are mounted within equipment 102 as described above, when it is desired to perform maintenance, one or both components may be easily removed on trolleys 126 so as to perform the maintenance or replacement in a fraction of the time presently required to perform such operations.

It is further contemplated that more than one component may be mounted on a single trolley so that the components together may be quickly and easily loaded into or removed from the equipment as described above.

A further embodiment of the present invention will now be described with reference to FIGS. 5–7. This embodiment shows a frame 102 for a SMIF minienvironment including a robot 110 and an aligner 112. This embodiment further shows a mid-plane configuration where the one or more components are mounted on tracks 120 located at a mid elevation of the equipment 102, in a generally horizontal plane. It is understood that the embodiment of FIGS. 1–4 may alternatively or additionally include a mid-plane track configuration, and that the embodiment of FIGS. 5–7 may alternatively or additionally include a bottom plane track configuration.

Figure 6:
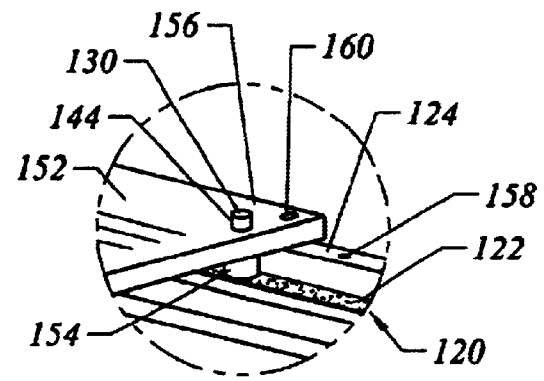
FIG. 6 is an enlarged perspective view of a portion of the system according to the present invention for mounting components within a piece of equipment.
Figure 5:
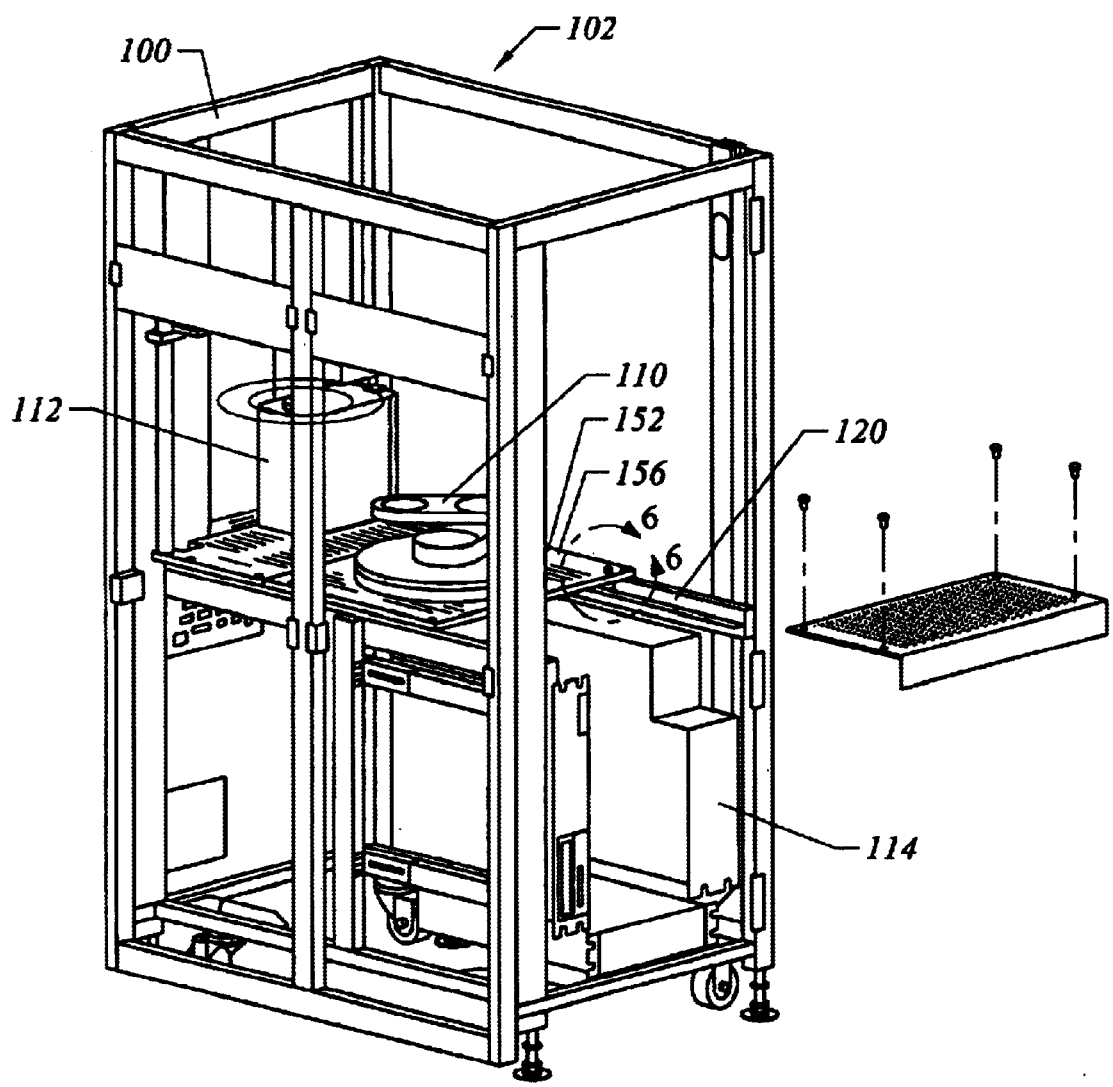
FIG. 5 is a perspective view of an alternative system according to the present invention for mounting components within a piece of equipment.
Figure 7:
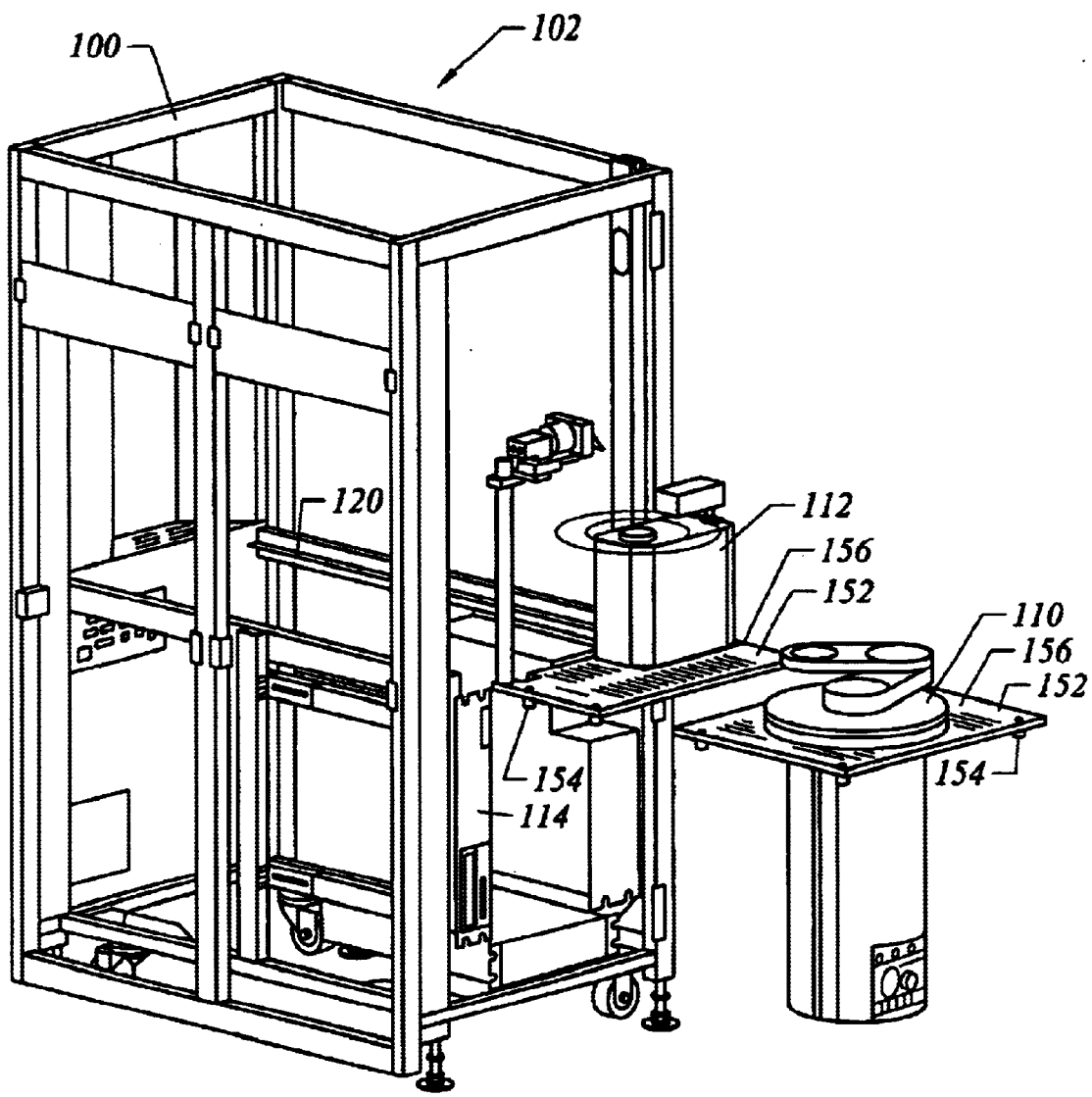
FIG. 7 is a perspective view showing the system according to the present invention for mounting components within a piece of equipment with the components shown removed from the equipment.

In the embodiment of FIGS. 5–7, the trolley and wheels of the prior embodiment are omitted, and instead a mounting plate 152, supporting the robot at a mid section of the robot is provided which includes four ball casters 154 at or near corners of the plate. This embodiment includes tracks 120 having horizontal base portion 122 and vertical wall portion 124 as described above. The casters ride on horizontal base portion 122 as best seen in FIG. 6 to allow easy loading and unloading of the robot into and from the frame 100.

The casters 154 are attached to the mounting plate 152 via jackscrews 130 which fit within threaded holes 144 down through the mounting plate. Once the robot is properly positioned within the frame 100, the jackscrews are rotated to lower the mounting plate until opposed edges 156 of the mounting plate 152 come to rest on the vertical wall portion 124 of tracks 120. At this point, further rotation of the jackscrews lift the casters 154 off of the horizontal base portion 122 of tracks 120 so that the mounting plate 152 and robot 110 are supported entirely on the vertical wall portions 124. The vertical wall portion 124 further includes a plurality of threaded holes 158 spaced along and down through a top horizontal section of tracks 120. Once the mounting plate 152 is supported on the tracks 120, bolts (not shown) may be fit down through through holes 160 in the mounting plate into threaded holes 158 to secure the mounting plate and robot in a fixed position with respect to the tracks 120 and frame 100.

As above, more than one component may include casters 154 so as to roll along tracks 120 for easy installation, maintenance and removal. As shown in FIGS. 5 and 7, the aligner 112 may include a mounting plate 152 having threaded holes 144 in which jackscrews 130 and casters 154 are located as in the robot 110 shown in FIGS. 5 and 7. Thus, both the robot and aligner can be easily moved into and out of the frame 100 on the casters 154, and then secured in a fixed position with respect to the tracks 120 and frame 100 by bolts fitting through holes 160 in the aligner mounting plate 152 into threaded holes 158 in the tracks 120.

Where two components, such as robot 110 and aligner 112 are mounted within equipment 102 as described above, when it is desired to perform maintenance, one or both components may be easily removed on casters 154 so as to perform the maintenance or replacement in a fraction of the time presently required to perform such operations.

It is contemplated that a single piece of equipment 102 include both bottom plane tracks and mid-plane tracks so that even more components can be mounted on rollers and/or wheels for easy installation, maintenance and removal.

While the description above has used robots, aligners and controllers as examples of the components to be moved and secured within the equipment 102 by the present invention, it is understood that a wide variety of other components found within a front end piece of equipment may be so mounted in accordance with the present invention. Further examples of such components include other power and control components, pumps, vacuum reservoirs and environmental control units. Moreover, while two different roller/wheel configurations have been described above, those of skill in the art will appreciate that other known roller/wheel configurations are contemplated. Furthermore, it is understood that actuators other than jackscrews may be used to lower and raise the trolley and mounting plate in alternative embodiments. In one alternative embodiment, the jackscrews may be driven by a motor controlled by controller 114 instead being manually rotated. Further still, it is appreciated that, once positioned by the roller/wheel mechanisms, various other fastening systems than those described above may be used to fasten the component or components in a fixed position within the frame 100.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

We claim:

1. A system for mounting a component within a semiconductor processing tool having an internal frame, comprising:

a pair of tracks mounted on the internal frame, said pair of tracks extending along a portion of the internal frame;

a cross member extending between said pair of tracks, said cross member having a mounting boss;

a trolley having a mounting surface for securing the component and a plurality of rolling elements for movably supporting said trolley along said pair of tracks, said mounting surface including a plurality of leveling holes each positioned substantially over one of said pair of tracks when said trolley is located on said pair of tracks and a mounting hole that is capable of being coaxially aligned with said mounting boss when said trolley is located on said pair of tracks;

a fastening device adapted to translate within said mounting hole, said fastening device secures said trolley to said mounting boss when said mounting hole and said mounting boss are coaxially aligned; and a plurality of actuators, each one of said plurality of actuators adapted to translate within one of said plurality of leveling holes to contact one of said pair of tracks and raise one of said plurality of rolling elements off said track to maintain said trolley in a desired position.

2. The system according to claim 1, wherein said plurality of actuators maintain said trolley in a substantially level orientation.

3. A system for positioning a component within semiconductor wafer fabrication equipment having an internal frame including a floor portion, comprising:

a track secured to the floor portion of the frame, said track including two substantially parallel supports positioned along the floor portion of the internal frame;

a cross beam extending between said track, said cross beam including a mounting boss extending upward from said cross beam;

a trolley having a mounting surface and wheels, said mounting surface includes a component mounting hole adapted to secure the component to said mounting surface, a trolley mounting hole, and a plurality of leveling holes, said wheels are rotatably mounted to said trolley so that said trolley may translate along said track to place the component in a desired mounting position;

a fastening device capable of fastening said trolley to the floor portion when said mounting boss is substantially coaxially aligned with said trolley mounting hole;

a plurality of actuators adapted to translate through each said leveling hole, each one of said plurality of actuators adapted to contact one of said pair of substantially parallel supports to lift one of said wheels off said track and move independently so that the orientation of said trolley may be adjusted relative to the internal frame.

\* \* \* \* \*